United States Patent
Taguchi et al.

(10) Patent No.: US 10,612,131 B2
(45) Date of Patent: Apr. 7, 2020

(54) VAPORIZATION SYSTEM AND VAPORIZATION SYSTEM PROGRAM

(71) Applicant: HORIBA STEC, Co., Ltd., Kyoto-shi, Kyoto (JP)

(72) Inventors: Akihiro Taguchi, Kyoto (JP); Ryoichi Kyoyama, Kyoto (JP)

(73) Assignee: HORIBA STEC, Co., Ltd., Kyoto-shi, Kyoto (JP)

( * ) Notice: Subject to any disclaimer, the term of this patent is extended or adjusted under 35 U.S.C. 154(b) by 0 days.

(21) Appl. No.: 16/175,683

(22) Filed: Oct. 30, 2018

(65) Prior Publication Data

US 2019/0136370 A1    May 9, 2019

(30) Foreign Application Priority Data

Nov. 7, 2017   (JP) .................. 2017-214381

(51) Int. Cl.
*C23C 14/54*    (2006.01)
*C23C 14/24*    (2006.01)
*C23C 16/448*   (2006.01)

(52) U.S. Cl.
CPC .............. *C23C 14/54* (2013.01); *C23C 14/24* (2013.01); *C23C 14/246* (2013.01); *C23C 14/543* (2013.01); *C23C 16/4485* (2013.01)

(58) Field of Classification Search
None
See application file for complete search history.

(56) References Cited

U.S. PATENT DOCUMENTS 3,855,372 A * 12/1974 Koch ................. F02M 27/02
                                                   261/131
4,276,243 A *  6/1981 Partus ................ B01J 4/008
                                                   236/12.12

FOREIGN PATENT DOCUMENTS

JP            2016211021 A       12/2016

* cited by examiner

*Primary Examiner* — Jethro M. Pence
(74) *Attorney, Agent, or Firm* — Alleman Hall Creasman & Tuttle LLP

(57) ABSTRACT

A vaporization system without a pressure sensor including: a vaporizer that vaporizes the liquid material; a supply amount controller that controls the supply amount of the liquid material to the vaporizer; a flow rate regulation valve that regulates the flow rate of vaporized gas produced by the vaporizer; a flow rate sensor that measures the flow rate of the vaporized gas; and a valve control part that outputs a drive signal to the flow rate regulation valve to control a valve opening level so that a measured flow rate measured by the flow rate sensor becomes equal to a predetermined set flow rate, is adapted to acquire a drive signal value that is a value indicated by the drive signal; and output a control signal to the supply amount controller on the basis of the drive signal value and control the supply of the liquid material.

4 Claims, 6 Drawing Sheets

VAPORIZATION SYSTEM AND VAPORIZATION SYSTEM PROGRAM

TECHNICAL FIELD

The present invention relates to a vaporization system adapted to vaporize a liquid material, and a vaporization system program used for the vaporization system.

BACKGROUND ART

In the past, as a system for producing gas used in a semiconductor manufacturing process such as a deposition process, as disclosed in Patent Literature 1, a vaporization system adapted to vaporize a liquid material has been used.

As this sort of vaporization system, there is one configured to provide a pressure sensor in a flow path for vaporized gas produced by a vaporizer and monitor pressure in the vaporizer. In doing so, when the pressure in the vaporizer falls as the amount of a liquid material in the vaporizer decreases and falls below a threshold value, by supplying the liquid material to the vaporizer, the liquid material in the vaporizer is prevented from running out, or when the pressure in the vaporizer rises as the liquid material is supplied to the vaporizer and exceeds the threshold value, by stopping supplying the liquid material, the liquid material is prevented from overflowing from the vaporizer.

However, when providing the pressure sensor in the flow path for the vaporized gas, the pressure sensor has to be one resistant to high temperature, and such a pressure sensor is expensive and/or large in size, thus preventing reductions in cost and size.

Further, when calibrating the pressure sensor, such as correcting the zero point of the pressure sensor, it is necessary to evacuate the vaporizer, causing the problem of poor maintainability as well.

CITATION LIST

Patent Literatures

Patent Literature 1: Japanese Unexamined Patent Application Publication No. 2016-211021

SUMMARY OF INVENTION

Technical Problem

Therefore, the present invention has been made in order to solve the above-described problems at once, and a main object thereof is to make it possible to appropriately control the supply of a liquid material without use of a pressure sensor.

Solution to Problem

That is, a vaporization system according to the present invention is one including: a vaporizer that vaporizes a liquid material; a supply amount controller that controls the supply amount of the liquid material to the vaporizer; a flow rate regulation valve that regulates the flow rate of vaporized gas produced by the vaporizer; a flow rate sensor that measures the flow rate of the vaporized gas; and a valve control part that outputs a drive signal to the flow rate regulation valve to control a valve opening level so that a measured flow rate measured by the flow rate sensor becomes equal to a predetermined set flow rate. In addition, the vaporization system is one including: a drive signal value acquisition part that acquires a drive signal value that is a value indicated by the drive signal; and a supply control part that outputs a control signal to the supply amount controller on a basis of the drive signal value and controls the supply of the liquid material.

The relationship between pressure in the vaporizer and the drive signal value now will be described.

When the pressure in the vaporizer falls as the amount of the liquid material in the vaporizer decreases, the pressure of the vaporized gas flowing into the flow rate regulation valve falls, and therefore in order to make the measured flow rate equal to the set flow rate, it is necessary to increase the valve opening level. Accordingly, when the pressure in the vaporizer falls, for example, in the case of the flow rate regulation valve of a normally open type, the valve control part decreases the drive signal value such as applied voltage or applied current to increase the valve opening level, whereas in the case of the flow rate regulation valve of a normally closed type, the valve control part increases the drive signal value such as applied voltage or applied current to increase the valve opening level.

On the other hand, when the pressure in the vaporizer rises as the liquid material is supplied to the vaporizer, the pressure of the vaporized gas flowing into the flow rate regulation valve rises, and therefore in order to make the measured flow rate equal to the set flow rate, it is necessary to decrease the valve opening level. Accordingly, when the pressure in the vaporizer rises, for example, in the case of the flow rate regulation valve of a normally open type, the valve control part increases the drive signal value such as applied voltage or applied current to decrease the valve opening level, whereas in the case of the flow rate regulation valve of a normally closed type, the valve control part decreases the drive signal value such as applied voltage or applied current to decrease the valve opening level.

That is, in the case where the flow rate regulation valve is of a normally open type, a decrease in the drive signal value indicates that the amount of the liquid material in the vaporizer decreases and the pressure in the vaporizer falls, whereas an increase in the drive signal value indicates that the amount of the liquid material in the vaporizer increases and the pressure in the vaporizer rises.

On the other hand, in the case where the flow rate regulation valve is of a normally closed type, an increase in the drive signal value indicates that the amount of the liquid material in the vaporizer decreases and the pressure in the vaporizer falls, whereas a decrease in the drive signal value indicates that the amount of the liquid material in the vaporizer increases and the pressure in the vaporizer rises.

Thus, in the above-described vaporization system, it is possible to supply the liquid material to the vaporizer before the liquid material runs out or stop supplying the liquid material before the liquid material overflows from the vaporizer by outputting the control signal to the supply amount controller on the basis of the value of the drive signal to the flow rate regulation valve and controlling the supply of the liquid material, and therefore the supply of the liquid material can be appropriately controlled without use of a pressure sensor.

Meanwhile, when the set flow rate is small, as illustrated in FIG. 5, a fall in the pressure associated with a decrease in the amount of the liquid material in the vaporizer is hardly observed until almost no liquid material remains. This is because when the set flow rate is small, the vaporized gas led out of the vaporizer can be compensated for by the vaporized gas resulting from vaporization of the liquid material in the vaporizer, and therefore the pressure in the vaporizer becomes equal to vapor pressure corresponding to the temperature of the liquid material as long as the liquid material exists in the vaporizer.

For this reason, the valve control part does not attempt to increase the valve opening level until almost no liquid material remains, and therefore when the set flow rate is small, controlling the supply of the liquid material on the basis of the drive signal value may cause runout of the liquid material.

Therefore, it is preferable that the vaporization system further includes a liquid level sensor provided in the vaporizer, and the supply control part outputs the control signal to the supply amount controller on the basis of, in addition to the drive signal value, a detected value from the liquid level sensor.

Such a configuration makes it possible to control the supply of the liquid material on the basis of the detected value of the liquid level sensor, and therefore even when the set flow rate is small, the supply of the liquid material can be appropriately controlled.

It is preferable that when the drive signal value decreases and falls below a predetermined threshold value, or when the drive signal value increases and exceeds the predetermined threshold value, the supply control part outputs the control signal to the supply amount controller to start supplying the liquid material or stop supplying the liquid material.

Such a configuration makes it possible to supply the liquid material to the vaporizer before the liquid material runs out or stop supplying the liquid material before the liquid material overflows from the vaporizer.

It is preferable that the threshold value is set to one predetermined value.

In such a configuration, by setting the threshold value depending on a condition highly likely to cause runout of the liquid material, such as when the set flow rate is set to the maximum value, the needs for adjusting the threshold value for mutually different set flow rates, making the supply control part read threshold values for the mutually different set flow rates, and other such operations can be eliminated.

Also, a vaporization system program according to the present invention is a program used for a vaporization system including: a vaporizer that vaporizes a liquid material; a supply amount controller that controls the supply amount of the liquid material to the vaporizer; a flow rate regulation valve that regulates the flow rate of vaporized gas produced by the vaporizer; and a flow rate sensor that measures the flow rate of the vaporized gas. In addition, the vaporization system program instructs a computer to fulfill functions as: a valve control part that outputs a drive signal to the flow rate regulation valve to control a valve opening level so that a measured flow rate measured by the flow rate sensor becomes equal to a predetermined set flow rate: a drive signal value acquisition part that acquires a drive signal value that is a value indicated by the drive signal; and a supply control part that outputs a control signal to the supply amount controller on a basis of the drive signal value and controls the supply of the liquid material.

By using such a program, the same working effect as that of the above-described vaporization system can be produced.

Advantageous Effects of Invention

According to the present invention configured as described above, the supply of the liquid material can be appropriately controlled without use of a pressure sensor.

DESCRIPTION OF EMBODIMENTS

In the following, one embodiment of the vaporization system according to the present invention will be described with reference to the drawings.

Figure 1:
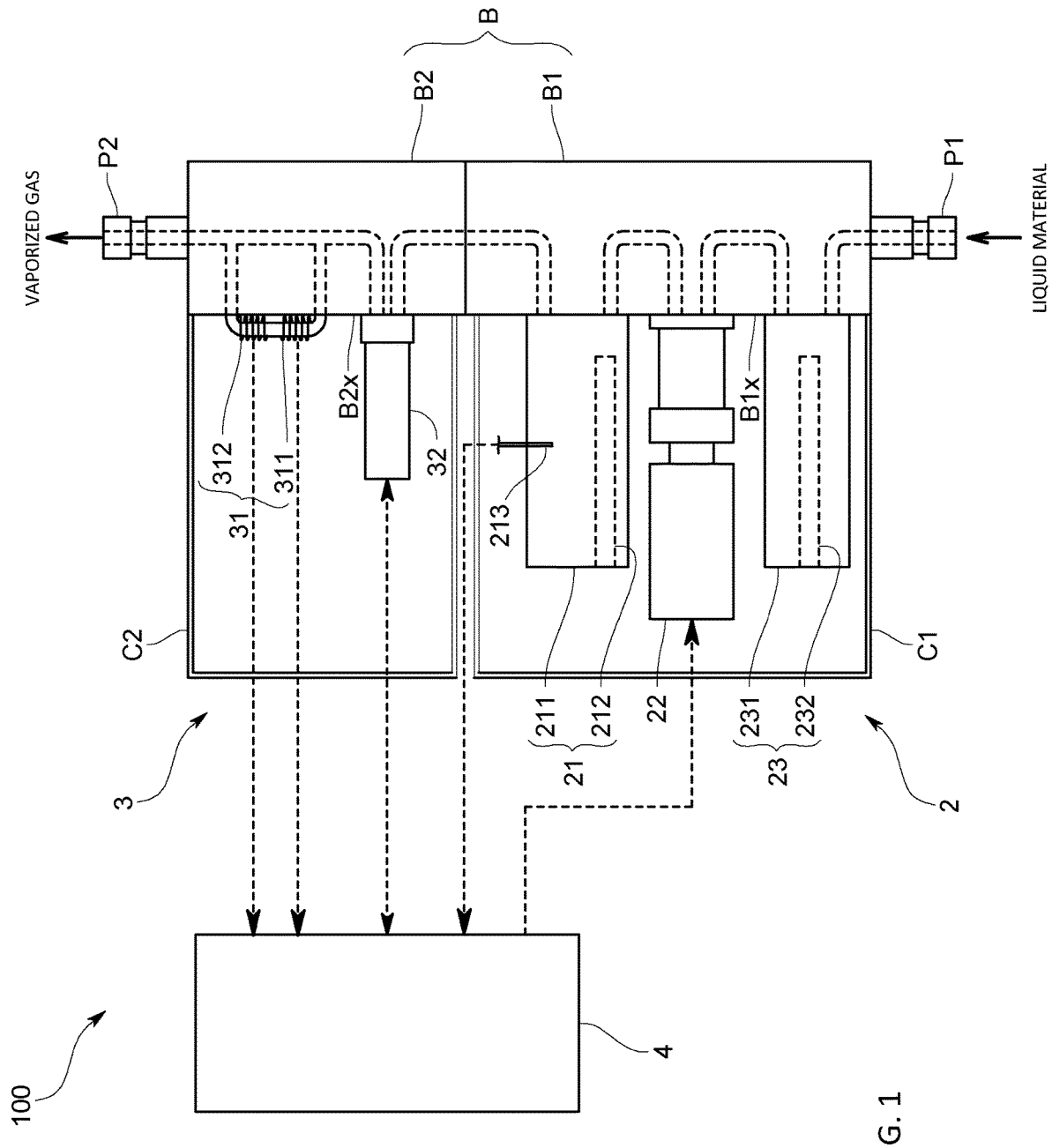
FIG. 1 is a diagram schematically illustrating the overall configuration of a vaporization system in the present embodiment.

A vaporization system 100 of the present embodiment is one for supplying a predetermined flow rate of gas to a chamber that is incorporated in, for example, a semiconductor manufacturing line or the like to perform a semiconductor manufacturing process, and as illustrated in FIG. 1, includes: a vaporization unit 2 that vaporizes a liquid material, a mass flow controller 3 that controls the flow rate of gas resulting from vaporization by the vaporization unit 2; and a control unit 4 that controls the operations of the vaporization unit 2 and the mass flow controller 3.

Note that, in the present embodiment, respective parts constituting the vaporization unit 2 are contained in a first case C1, and respective parts constituting the mass flow controller 3 are contained in a second case C2 that is a separate body from the first case C1; however, the respective parts constituting the vaporization unit 2 and the respective parts constituting the mass flow controller 3 may be contained in the same case.

The vaporization unit 2 includes: a vaporizer 21 that vaporizes the liquid material by, for example, a baking method; a supply amount controller 22 that controls the supply amount of the liquid material to the vaporizer 21; and a preheater 23 that preheats the liquid material to be supplied to the vaporizer 21 to a predetermined temperature.

The vaporizer 21, supply amount controller 22, and preheater 23 are attached on a device attachment surface B1$x$ set on one surface of a body block B1 (hereinafter referred to as a first body block B1) that is a manifold block inside which a flow path is formed. In addition, the first body block B1 is one made of metal such as stainless steel and formed in a substantially rectangular parallelepiped shape having a longer direction. Also, the device attachment surface B1$x$ is a surface formed in a rectangular shape having a longer direction. Further, the first body block B1 in the present embodiment is installed in a semiconductor manufacturing line or the like with the longer direction thereof facing in an up-down direction (vertical direction).

The vaporizer 21 includes: a storage container 211 as a vaporization tank having inside a space for storing the liquid material; and a vaporization heater 212 provided in the storage container 211 to vaporize the liquid material. The storage container 211 is provided with a liquid level sensor 213 for sensing the storage amount of stored liquid material. The liquid level sensor 213 in the present invention is provided inserted into the storage container 211 from the upper wall of the storage container 211, and specifically, a sensor of a so-called self-heating type adapted to measure thermal resistance around the liquid level sensor 213. In addition, as the liquid level sensor 213, various types of sensors can be used, such as ones of a liquid temperature measurement type, magnetic type, capacitance type, and ultrasonic type.

The supply amount controller 22 is a control valve that controls the supply flow rate of the liquid material to the vaporizer 21, and in the present embodiment, an electromagnetic open/close valve. Specifically, the electromagnetic open/close valve 22 is configured so that the valve body (not illustrated) thereof opens or closes an opening of the internal flow path formed in the first body block B1 to supply or stop supplying the liquid material to the vaporizer 21.

By using the open/close valve as the supply amount controller 22 as described above, as compared with when using a mass flow controller as the supply amount controller 22, the vaporizer 2 can be reduced in size. In addition, since the electromagnetic open/close valve 22 is used as the supply amount controller 22, a rapid variation in pressure in the vaporizer 21 can be suppressed by slowing down the opening/closing operation thereof.

Note that the supply amount controller 22 is not necessarily required to be the open/close valve. For example, the supply amount controller 22 may be a control valve such as a piezo valve, a mass flow controller including the control valve, or the like. In this case, the supply amount of the liquid material to be supplied to the vaporizer 21 can be controlled by controlling the valve opening level of the control valve using the detected value of the above-described liquid level sensor 213 or the below-described drive signal value for the flow rate regulation valve 32.

The preheater 23 includes: a preheating block 231 formed inside with a flow path through which the liquid material flows; and a preheating heater 232 provided in the preheating block 231 to preheat the liquid material. The preheater 23 heats the liquid material to temperature (less than a boiling point) just before the vaporization.

In the vaporization unit 2 configured as described above, the liquid material introduced from a liquid material introduction port P1 is preheated to the predetermined temperature by flowing through the flow path in the preheating block 231 of the preheater 23. The liquid material preheated by the preheater 23 is introduced into the vaporizer 21 by controlling the electromagnetic open/close valve 22 as the supply amount controller. Then, in the vaporizer 21, the liquid material is brought into a state of being constantly stored, and vaporized, and the resulting vaporized gas is continuously produced and then continuously led out to the mass flow controller 3.

Next, the mass flow controller 3 will be described.

The mass flow controller 3 includes: a fluid sensor 31 that senses the vaporized gas flowing through a flow path; and the flow rate regulation valve 32 that controls the flow rate of the vaporized gas flowing through a flow path. In addition, the fluid sensor 31 is constituted by a first heating resistor 311 provided on the upstream side of the flow path and a second heating resistor 312 provided on the downstream side of the flow path. Also, the flow rate regulation valve 32 is a control valve that controls the flow rate of the vaporized gas produced by the above-described vaporizer 21, and in the present embodiment, a piezo valve of a so-called normally open type.

The fluid sensor 31 and the flow rate regulation valve 32 are attached on a device attachment surface B2x set on one surface of a body block B2 (hereinafter referred to as a second body block B2) that is a manifold block inside which the flow paths are formed. In addition, the second body block B2 is one made of metal such as stainless steel and formed in a substantially rectangular parallelepiped shape having a longer direction. Also, the device attachment surface B2x is a surface formed in a rectangular shape having a longer direction. Further, the width dimension of the device attachment surface B2x of the second body block B2 is the same as that of the device attachment surface B1x of the first body block B1.

In addition, the second body block B2 of the mass flow controller 3 is connected to the first body block B1 of the vaporization unit 2 by screws or the like, and thereby a main body block B is formed. The main body block B is installed in a semiconductor manufacturing line or the like with the longer direction thereof facing in the up-down direction (vertical direction) so that the liquid material introduction port P1 is positioned on the lower side and a vaporized gas lead-out port P2 is positioned on the upper side. Note that the second body block B2 is not necessarily required to be directly connected to the first body block B1, but only has to be fluidically connected via, for example, a piping joint or the like. By indirectly connecting the second body block B2 to the first body block B1 as described, the mass flow controller 3 can be detached from the vaporization unit 2 and thereby separately configured. In doing so, the mass flow controller 3 is stabilized without the effect of the temperature of the vaporization unit 2.

Next, the control unit 4 will be described.

The control unit 4 is one configured to supply the liquid material to the vaporizer 21 during vaporizing operation by controlling the above-described electromagnetic open/close valve 22.

Figure 2:
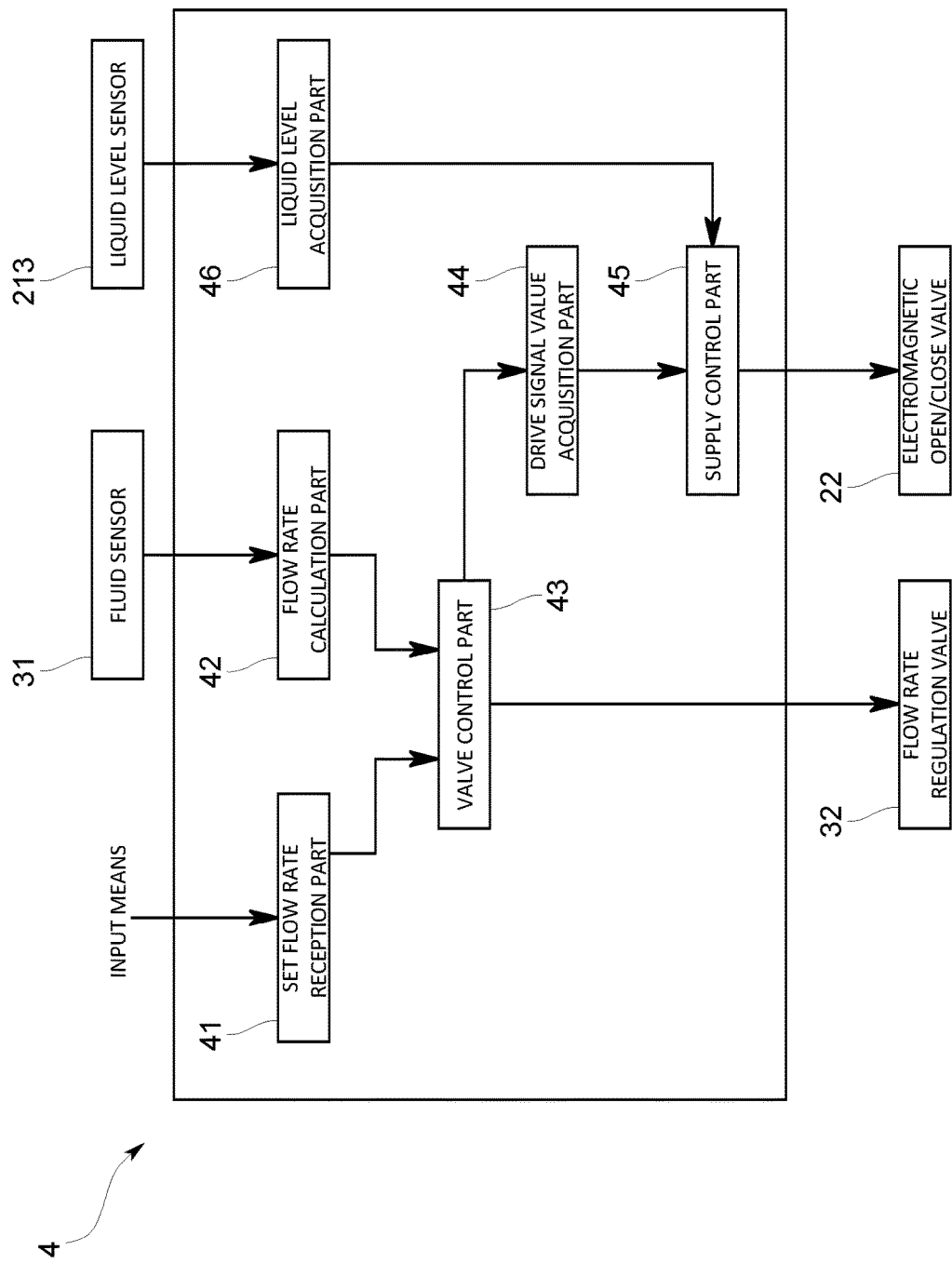
FIG. 2 is a functional block diagram illustrating functions of a control unit in the same embodiment.

Specifically, the control unit 4 is a so-called computer including a CPU, a memory, an AC/DC converter, input means, and the like. In addition, the CPU executes a program stored in the memory, and thereby as illustrated in FIG. 2, the control unit 4 has functions as a set flow rate reception part 41, flow rate calculation part 42, valve control part 43, drive signal value acquisition part 44, and supply control part 45.

The respective parts will be described below.

The set flow rate reception part 41 is one that receives a set flow rate signal indicating a set flow rate inputted by a user's input operation through the input means such as a keyboard or transmitted from another device.

The flow rate calculation part 42 is one that acquires an output signal from the fluid sensor 31 to calculate the flow rate of the vaporized gas flowing through the internal flow path of the second body block B2. Here, the flow rate calculation part 42 and the above-described fluid sensor 31 constitute a flow rate sensor for measuring the flow rate of the vaporized gas, and the flow rate sensor in the present embodiment is one of a thermal type. In addition, the flow rate sensor may be one of a pressure type.

The valve control part 43 is one that controls the flow rate regulation valve 32 on the basis of the set flow rate and the measured flow rate calculated by the flow rate calculation part 42, and here outputs a drive signal to the flow rate regulation valve 32 to control a valve opening level so that the measured flow rate becomes equal to the set flow rate. The drive signal is a signal indicating applied voltage or applied current (hereinafter also referred to as the drive signal value) to be applied to the flow rate regulation valve 32, and by outputting the drive signal to the flow rate regulation valve 32, the valve opening level is feedback-controlled here.

Describing more specifically, for example, when pressure in the vaporizer 21 falls as the amount of the liquid material in the vaporizer 21 decreases, the pressure of the vaporized gas flowing into the flow rate regulation valve 32 falls, and therefore in order to make the measured flow rate equal to the set flow rate, it is necessary to increase the valve opening level of the flow rate regulation valve 32. At this time, the valve control part 43 varies the drive signal value to be outputted to the flow rate regulation valve 32 so as to increase the valve opening level.

On the other hand, for example, when the pressure in the vaporizer 21 rises by supplying the liquid material into the vaporizer 21, the pressure of the vaporized gas flowing into the flow rate regulation valve 32 rises, and therefore in order to make the measured flow rate equal to the set flow rate, it is necessary to decrease the valve opening level of the flow rate regulation valve 32. At this time, the valve control part 43 varies the drive signal value to be outputted to the flow rate regulation valve 32 so as to decrease the valve opening level.

In the present embodiment, since the flow rate regulation valve 32 is of a normally open type as described above, as illustrated in FIG. 3, when the pressure in the vaporizer 21 falls (i.e., when the amount of the liquid material in the vaporizer 21 decreases and consequently a liquid level reduces), the valve control part 43 decreases the drive signal value to increase the valve opening level. On the other hand, when the pressure in the vaporizer 21 rises (i.e., when the amount of the liquid material in the vaporizer increases and consequently the liquid level increases), the valve control part 43 increases the drive signal value to decrease the valve opening level.

In addition, if the flow rate regulation valve 32 is one of a normally closed type, when the pressure in the vaporizer 21 falls, the valve control part 43 increases the drive signal value to increase the valve opening level, whereas when the pressure in the vaporizer 21 rises, the valve control part 43 decreases the drive signal value to decrease the valve opening level.

The drive signal value acquisition part 44 is one that acquires the drive signal value outputted from the valve control part 43 to the flow rate regulation valve 32, and transmits the acquired drive signal value to the below-described supply control part 45.

The supply control part 45 is one that controls the above-described electromagnetic open/close valve 22 on the basis of the drive signal value acquired by the drive signal value acquisition part 44.

Figure 3:
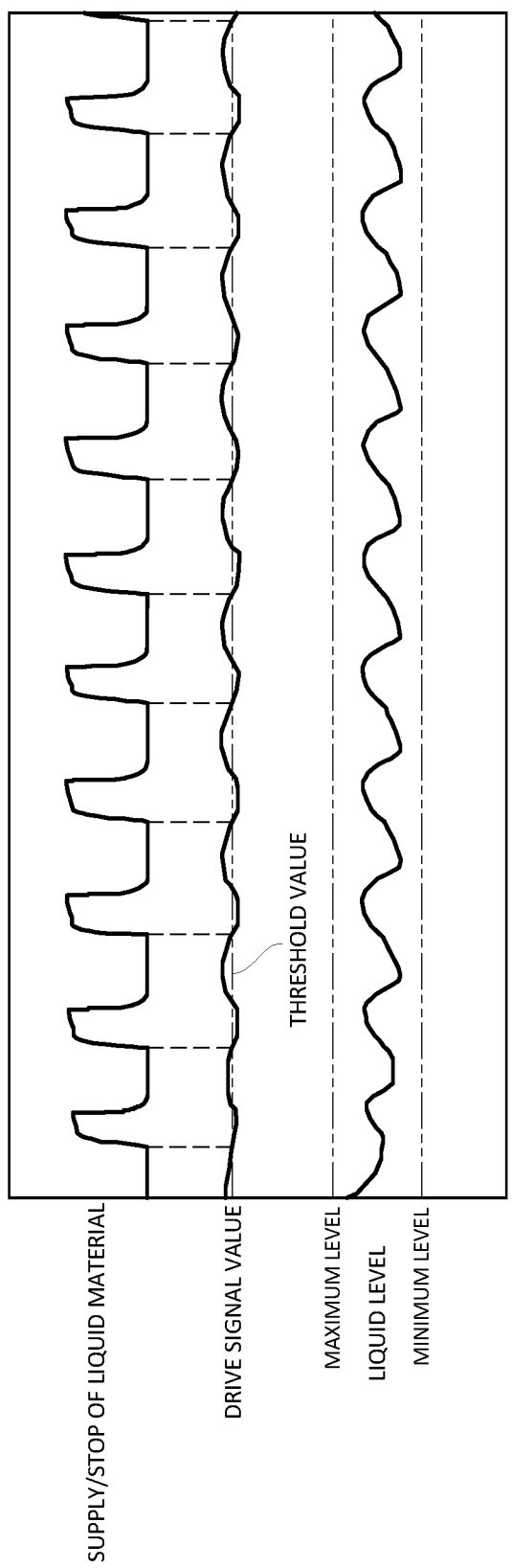
FIG. 3 is a diagram for explaining control contents of the control unit in the same embodiment.

Specifically, as illustrated in FIG. 3, the supply control part 45 compares the drive signal value and a preset threshold value to control the electromagnetic open/close valve 22. In the present embodiment, as described above, when the pressure in the vaporizer 21 falls as the amount of the liquid material in the vaporizer 21 decreases, the drive signal value outputted from the valve control part 43 to the flow rate regulation valve 32 also decreases, and when the drive signal value decreases and falls below the threshold value, the supply control part 45 outputs a control signal to the electromagnetic open/close valve 22 to start supplying the liquid material.

Subsequently, after a predetermined time has passed since the supply of the liquid material was started, the supply control part 45 outputs the control signal to the electromagnetic open/close valve 22 to stop supplying the liquid material.

On the other hand, as described above, when the pressure in the vaporizer 21 rises as the liquid material is supplied into the vaporizer 21, the drive signal value outputted from the valve control part 43 to the flow rate regulation valve 32 also increases, and when the drive signal value increases and exceeds the threshold value, the supply control part 45 outputs the control signal to the electromagnetic open/close valve 22 to stop supplying the liquid material. In addition, the threshold value set for a decrease in the drive signal value and the threshold value set for an increase in the drive signal value are the same value here, but may be mutually different values.

Figure 4:
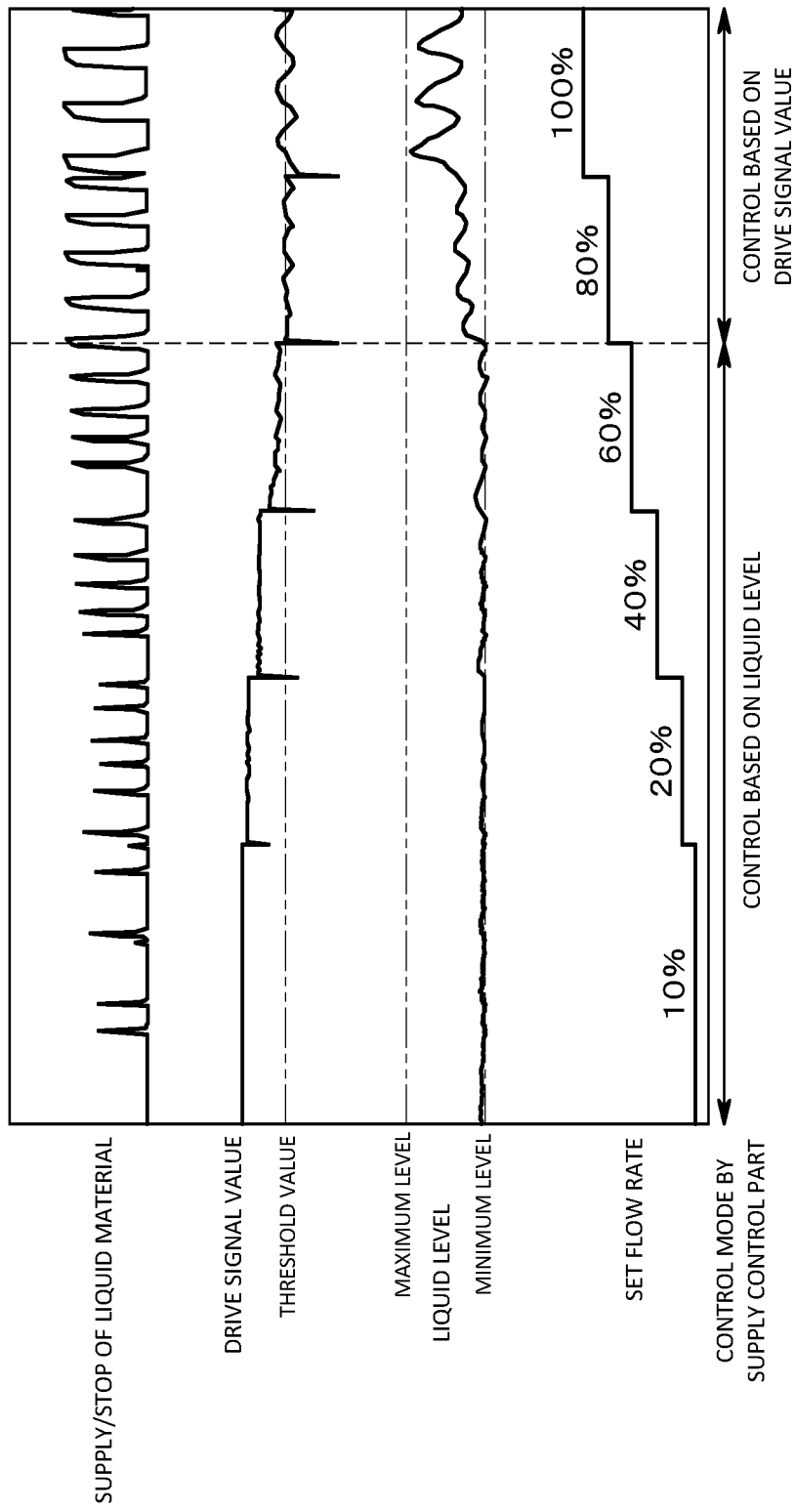
FIG. 4 is a diagram for explaining a first control mode and a second control mode by the control unit in the same embodiment.

In the present embodiment, as illustrated in FIG. 4, even when the set flow rate changes, the threshold value for the drive signal value remains to be the same vale without change for mutually different set flow rates before and after the change. However, the threshold value for the drive signal value may be set to a different value depending on a set flow rate.

Figure 5:
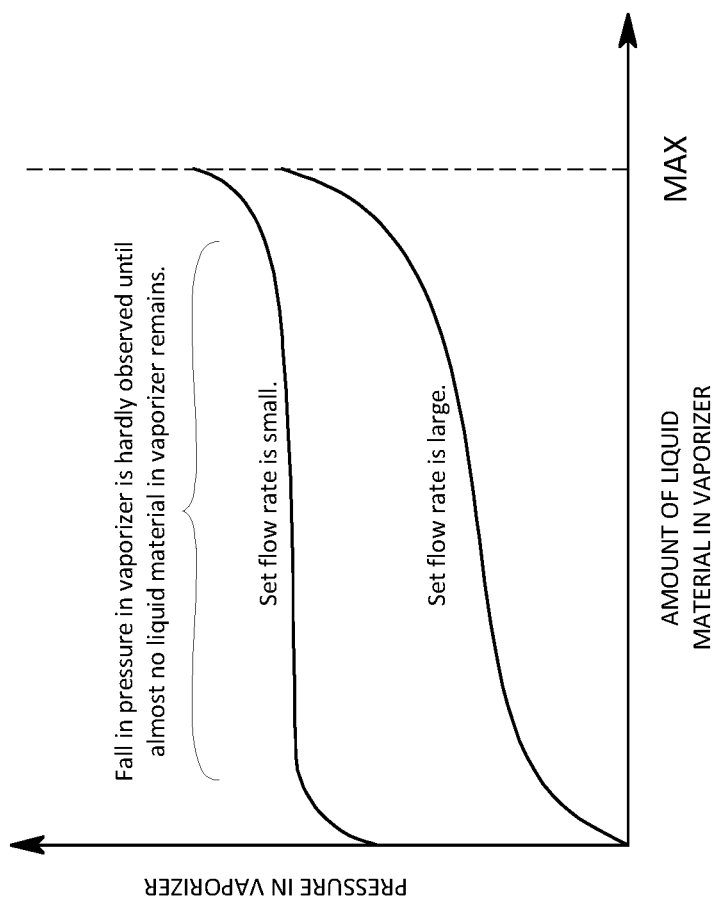
FIG. 5 is a diagram illustrating the relationship between the storage amount of a liquid material in a vaporizer and pressure in the vaporizer.

Meanwhile, when the set flow rate is small, as illustrated in FIG. 5, a fall in the pressure associated with a decrease in the amount of the liquid material in the vaporizer 21 is hardly observed until almost no liquid material remains. This is because when the set flow rate is small, the vaporized gas led out of the vaporizer 21 can be compensated for by the vaporized gas resulting from vaporization of the liquid material in the vaporizer 21, and therefore the pressure in the vaporizer 21 becomes equal to vapor pressure corresponding to the temperature of the liquid material as long as the liquid material exists. For this reason, the valve control part 43 does not work to increase the valve opening level until almost no liquid material remains. That is, when the set flow rate is small, the drive signal value outputted from the valve control part 43 to the flow rate regulation valve 32 little varies until almost no liquid material remains, and therefore when attempting to control the supply of the liquid material on the basis of the drive signal value, the liquid material may run out.

In response to this, the control unit 4 in the present embodiment further includes a function as a liquid level acquisition part 46, and the valve control part 43 is configured to control the supply of the liquid material on the basis of, in addition to the above-described drive signal value, the detected value detected by the liquid level sensor 213.

The liquid level acquisition part 46 is one that acquires a detected value signal outputted from the above-described liquid level sensor 213, and transmits a detected value (here, a liquid level) indicated by the detected value signal to the above-described supply control part 45.

Further, as illustrated in FIG. 4, when the liquid level detected by the liquid level sensor 213 falls below a predetermined minimum level or exceeds a predetermined maximum level, an abnormality signal indicating this is outputted from the liquid level acquisition part 46 to the supply control part 45, and the supply control part 45 in the present embodiment forcibly turns on or off the electromagnetic open/close valve 22 regardless of the drive signal value.

Specifically, for example, when the liquid level detected by the liquid level sensor 213 falls below the minimum level, the supply control part 45 outputs the control signal to the electromagnetic open/close valve 22 to start supplying the liquid material to the vaporizer 21, whereas when the liquid level detected by the liquid level sensor 213 exceeds the maximum level, the supply control part 45 stops supplying the liquid material.

Figure 6:
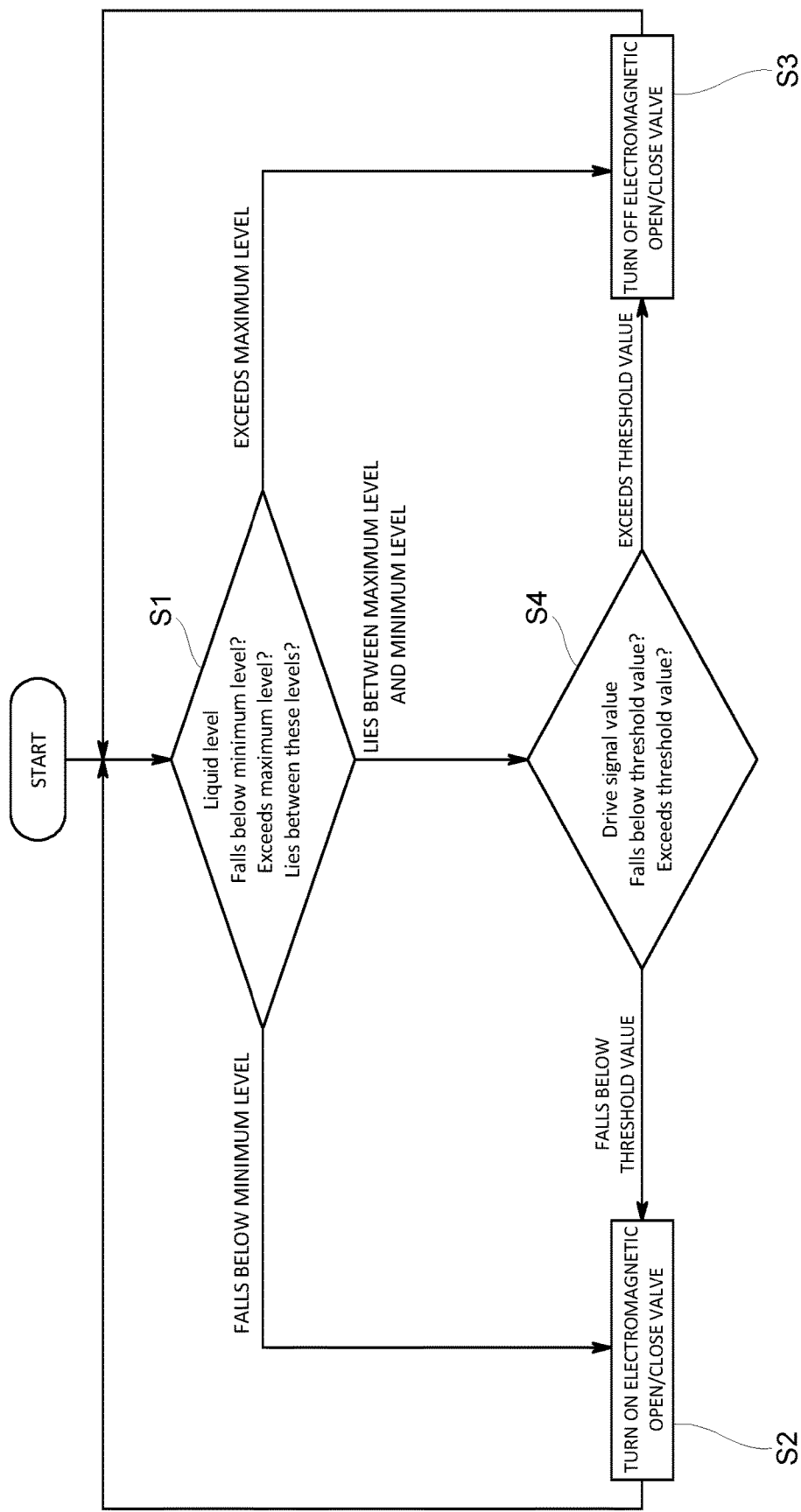
FIG. 6 is a flowchart illustrating the operation of the control unit in the same embodiment.

Next, the operation of the vaporization system 100 of the present embodiment will be described with reference to a flowchart of FIG. 6.

First, when the operation of the vaporization system 100 is started, the liquid level acquisition part 46 acquires a liquid level detected by the liquid level sensor to determine whether the liquid level exceeds the maximum level, falls below the minimum level, or lies between the maximum level and the minimum level (S1).

When the liquid level falls below the minimum level, an abnormality signal indicating this is outputted from the liquid level acquisition part 46 to the supply control part 45, and the supply control part 45 opens the electromagnetic open/close valve 22 (S2). Also, when the liquid level exceeds the maximum level, an abnormality signal indicating this is outputted from the liquid level acquisition part 46 to the supply control part 45, and the supply control part 45 closes the electromagnetic open/close valve 22 (S3).

Further, when the liquid level lies between the maximum level and the minimum level, the drive signal value acquisition part 44 acquires the drive signal value from the valve control part 43, and on the basis of the drive signal value, the supply control part 45 outputs the control signal to the electromagnetic open/close valve 22.

Specifically, the supply control part 45 compares the drive signal value and the predetermined threshold value to determine whether the drive signal value falls below the threshold value or exceeds the threshold value (S4).

Then, when the drive signal value decreases and falls below the threshold value, the supply control part 45 outputs the control signal to the electromagnetic open/close valve 22 to open the electromagnetic open/close valve 22 (S2), and starts supplying the liquid material.

On the other hand, when the drive signal value exceeds the threshold value, the supply control part 45 outputs the control signal to the electromagnetic open/close valve 22 to close the electromagnetic open/close valve (S3), and stops supplying the liquid material.

After that, the flow returns to S1, and the above-described operation is repeated until an operation end signal for ending the operation of the vaporization system 100 is inputted to the control unit 4.

In the vaporization system 100 according to the present embodiment configured as described above, since the supply control part 45 outputs the control signal to the electromagnetic open/close valve 22 on the basis of the drive signal value outputted from the valve control part 43 to the flow rate regulation valve 32, without providing a pressure sensor for detecting the pressure in the vaporizer 21, the liquid material can be supplied to the vaporizer 21 at appropriate timing before the liquid material in the vaporizer 21 runs out, or the supply of the liquid material can be stopped before the liquid material overflows from the vaporizer 21.

As a result, since the need for a pressure sensor is eliminated, cost and system size can be correspondingly reduced. In addition, the need to work to evacuate the vaporizer 21, which was needed to calibrate a pressure sensor, can be eliminated, and maintainability can also be improved.

Further, also conceivable is an embodiment adapted to, using various parameters such as temperature in addition to the drive signal value, calculate the valve opening level to be controlled by the valve control part 43, and control the electromagnetic open/close valve 22 using the valve opening level. However, since the various parameters are used, control becomes complicated and therefore such embodiment is difficult to use.

Also, when comparing the pressure in the vaporization tank 211 detected by a pressure sensor and a threshold value to control the supply of the liquid material as in the conventional case, required pressure in the vaporization tank 211 is different depending on the set flow rate of the mass flow controller 3, and therefore the threshold value for pressure has to be set for each set flow rate. Further, when the set flow rate is large, the flow rate of the vaporized gas resulting from vaporization in the vaporization tank 211 cannot follow the flow rate of the vaporized gas led out of the vaporization tank 21 in some cases. In that case, the pressure in the vaporization tank 211 varies (falls), and therefore it is very difficult to appropriately set the threshold value. In addition, the pressure detected by the pressure sensor is affected by pressure on the secondary side (downstream side) of the mass flow controller 3, and therefore threshold value setting corresponding to the secondary side pressure, correction taking account of the secondary side pressure, or the like by separately providing a pressure sensor on the secondary side of the mass flow controller or taking another means is required.

In contrast, since the vaporization system 100 according to the present embodiment can eliminate the need for a pressure sensor as described above, the above-described various problems associated with control using a pressure sensor can be solved.

For example, when pressure loss occurs due to clogging of the flow path or flow rate regulation valve 32 through which the vaporized gas flows or due to another cause, the mass flow controller 3 operates to increase the valve opening level of the flow rate regulation valve 32 in order to ensure the flow rate of the vaporized gas.

In this case, the vaporization system 100 according to the present embodiment acquires a drive signal value for the above-described operation to increase the valve opening level, and while comparing the drive signal value and the threshold value, operates to raise the pressure in the tank by supplying the liquid material to the tank. Accordingly, even when the above-described pressure loss occurs, the vaporization system 100 can be operated on a long-term basis to lengthen the life thereof without making a special correction or providing a special threshold value.

Also, since the threshold value for the drive signal value is set to the same value for mutually different set flow rates, the needs for adjusting the threshold value for the mutually different set flow rates, making the supply control part 45 read threshold values for the mutually different set flow rates, and other such operations can be eliminated.

Further, since the supply control part 45 is configured to output the control signal to the electromagnetic open/close valve 22 on the basis of, in addition to the drive signal value, the detected value from the liquid level sensor 213, even when the set flow rate is small, the supply of the liquid material can be controlled on the basis of the detected value of the liquid level sensor, and the supply of the liquid material can be appropriately controlled for various set flow rates.

Note that the present invention is not limited to the above-described embodiment.

For example, the above-described embodiment describes the case where the flow rate regulation valve 32 is one of a normally open type. However, if the flow rate regulation valve 32 is one of a normally closed type, when the pressure in the vaporizer 21 falls as the amount of the liquid material in the vaporizer 21 decreases, the drive signal value outputted from the valve control part 43 to the flow rate regulation valve 32 increases. In this case, as the function of the supply control part 45, an embodiment adapted to, when the drive signal value increases and exceeds the threshold value, output the control signal to the electromagnetic open/close valve 22 to start supplying the liquid material can be cited.

Also, the control unit 4 may include a control mode switching part that, on the basis of the set flow rate, switches a control mode of the electromagnetic open/close valve 22 by the supply control part 45 between a first control mode in which the control signal is outputted to the electromagnetic open/close valve 22 on the basis of the drive signal value and a second control mode in which the control signal is outputted to the electromagnetic open/close valve 22 on the basis of the detected value from the liquid level sensor 213. In addition, in place of the set flow rate, the measured flow rate calculated by the flow rate calculation part 42 may be used.

Specifically, as the control mode switching part, one configured to compare the set flow rate and a preset first flow rate, when the set flow rate is larger than the first flow rate, switch the control mode by the supply control part 45 to the first control mode, and when the set flow rate is smaller than the first flow rate, switch the control mode by the supply control part 45 from the first control mode to the second control mode can be cited.

Further, the control mode switching part may be configured to, when the set flow rate is further larger than a predetermined second flow rate larger than the first flow rate, switch the control mode by the supply control part 45 from the first control mode to the second control mode.

In the above-described embodiment, the functions as the set flow rate reception part 41, flow rate calculation part 42, and valve control part 43 for controlling the operation of the mass flow controller 3 and the functions as the drive signal value acquisition part 44, the supply control part 45, and the liquid level acquisition part 46 for controlling the supply of the liquid material to the vaporizer 21 are provided to the control unit 4 in common, but may be provided to mutually different two or more control units.

In addition, the first body block B1 and the second body block B2 are arranged with the longer directions of them facing in the up-down direction (vertical direction), but may be arranged with the longer directions of them facing in the horizontal direction. Further in addition, the first body block B1 and the second body block B2 may be configured as an integrated block.

Also, a method for controlling the flow rate or pressure of the fluid on the upstream side of the flow rate regulation valve on the basis of the drive signal value such as applied voltage or applied current to the flow rate regulation valve is applicable not only to the vaporization system but to various fluid control systems, and this makes it possible to control fluid without use of a pressure sensor.

Further, the vaporization system of the above-described embodiment is used to vaporize the liquid material, but may be used to vaporize liquid prepared by, for example, melting a solid material.

Besides, it should be appreciated that the present invention is not limited to the above-described embodiment, but can be variously modified without departing from the scope thereof.

LIST OF REFERENCE CHARACTERS

100: Vaporization system
21: Vaporizer
22: Supply amount controller
32: Flow rate regulation valve
43: Valve control part
44: Drive signal value acquisition part
45: Supply control part

The invention claimed is:

1. A vaporization system comprising:
a vaporizer that vaporizes a liquid material;
a supply amount valve that controls a supply amount of the liquid material to the vaporizer;
a flow rate regulation valve that regulates a flow rate of vaporized gas produced by the vaporizer;
a flow rate sensor that measures the flow rate of the vaporized gas; and
a controller that outputs a drive signal directly to the flow rate regulation valve to control a valve opening level so that a measured flow rate measured by the flow rate sensor becomes equal to a predetermined set flow rate, and further comprising:
a drive signal value acquisition part that directly acquires a drive signal value that is a value indicated by the drive signal outputted by the controller to the flow rate regulation valve, and that indicates applied voltage or applied current to the flow rate regulation valve; and
a supply control part that outputs a control signal directly to the supply amount valve on a basis of the drive signal value indicating applied voltage or applied current to the flow rate regulation valve and controls the supply amount of the liquid material.

2. The vaporization system according to claim 1, further comprising
a liquid level sensor provided in the vaporizer, wherein
the supply control part outputs the control signal to the supply amount valve on a basis of, in addition to the drive signal value, a detected value from the liquid level sensor.

3. The vaporization system according to claim 1, wherein when the drive signal value decreases and falls below a predetermined threshold value, or when the drive signal value increases and exceeds the predetermined threshold value, the supply control part outputs the control signal to the supply amount valve to start supplying the liquid material or stop supplying the liquid material.

4. The vaporization system according to claim 3, wherein the threshold value is set to one predetermined value.

* * * * *